(12) United States Patent
Verdes et al.

(10) Patent No.: US 6,425,678 B1
(45) Date of Patent: Jul. 30, 2002

(54) LED OBSTRUCTION LAMP

(75) Inventors: Anthony Verdes, Brick; Rand Eikelberger, Allenwood, both of NJ (US)

(73) Assignee: Dialight Corporation, Manasquan, NJ (US)

( * ) Notice: Subject to any disclaimer, the term of this patent is extended or adjusted under 35 U.S.C. 154(b) by 0 days.

(21) Appl. No.: 09/378,711

(22) Filed: Aug. 23, 1999

(51) Int. Cl.⁷ .................................................. F21V 5/00
(52) U.S. Cl. ........................ 362/244; 362/240; 362/294; 362/153.1; 362/374
(58) Field of Search ................................ 362/244, 246, 362/326, 329, 800, 240, 153.1, 294, 251, 374

(56) References Cited

U.S. PATENT DOCUMENTS

| | | | | |
|---|---|---|---|---|
| 1,801,047 A | * | 4/1931 | Johnson ....................... | 362/374 |
| 5,519,596 A | * | 5/1996 | Woolverton ................. | 362/250 |
| 5,685,637 A | * | 11/1997 | Chapman et al. ........... | 362/263 |
| 5,785,418 A | * | 7/1998 | Hochstein ................... | 362/373 |
| 5,806,965 A | * | 9/1998 | Deese .......................... | 362/249 |
| 6,149,283 A | * | 11/2000 | Conway et al. .............. | 362/236 |

* cited by examiner

Primary Examiner—Thomas M. Sember
Assistant Examiner—David V. Hobden
(74) Attorney, Agent, or Firm—Oblon, Spivak, McClelland, Maier & Neustadt, P.C.

(57) ABSTRACT

An obstruction lamp which replaces conventional incandescent light bulbs and which utilizes light emitting diodes (LEDs) in an illumination unit. The obstruction lamp includes a first plurality of LEDs connected in series. The first plurality of LEDs are mounted onto a metal vertical cylinder which provides a heat sinking for the first plurality of LEDs. A lens is configured to cover the first plurality of LEDs and the metal vertical cylinder. A metal base is provided on which the first plurality of LEDs, the metal vertical cylinder, and the lens are mounted. Further, a clamp is configured to seal the lens to the metal base. A second plurality of LEDs may be connected electrically independently of the first plurality of LEDs and may be mounted on top of the metal vertical cylinder. A wire housing may be configured to attach to the metal base and to provide electrical connection to the first and/or second plurality of LEDs. An adapter may be configured to attach to the metal base and to an existing incandescent obstruction lamp housing. The metal vertical cylinder can include driving circuit boards configured to drive the first and/or second plurality of LEDs. The first plurality of LEDs may be high power LEDs and the second plurality of LEDs may be lower power LEDs which are provided more for aesthetic purposes than for providing light output.

6 Claims, 4 Drawing Sheets

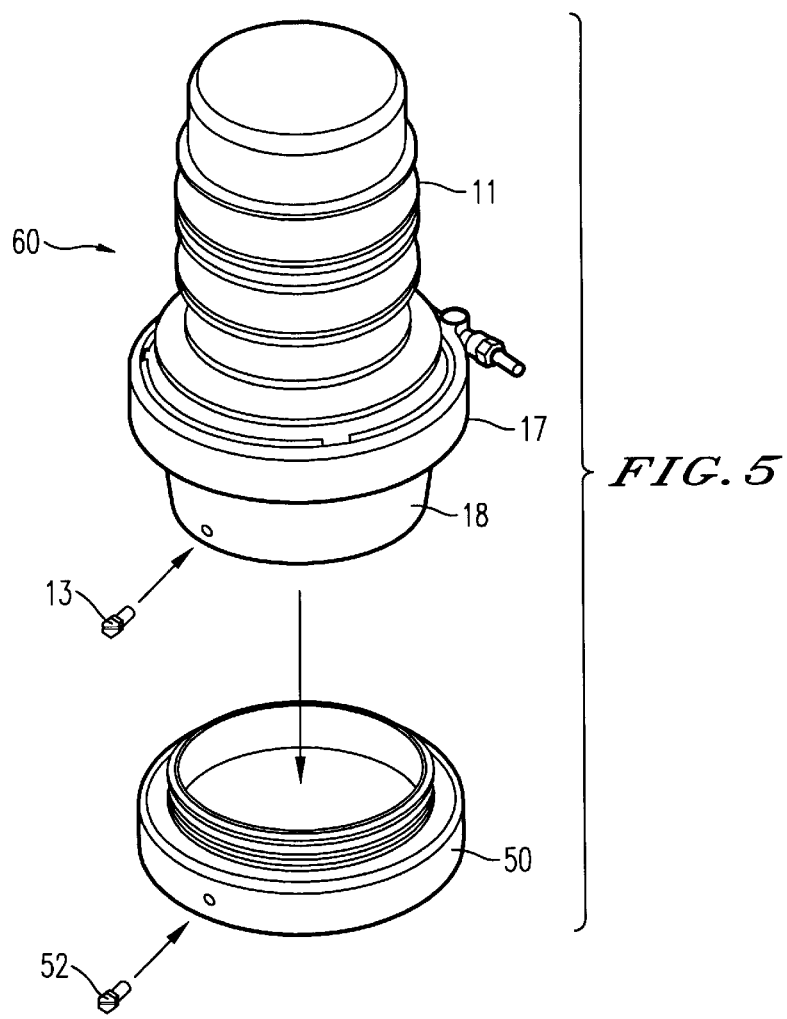
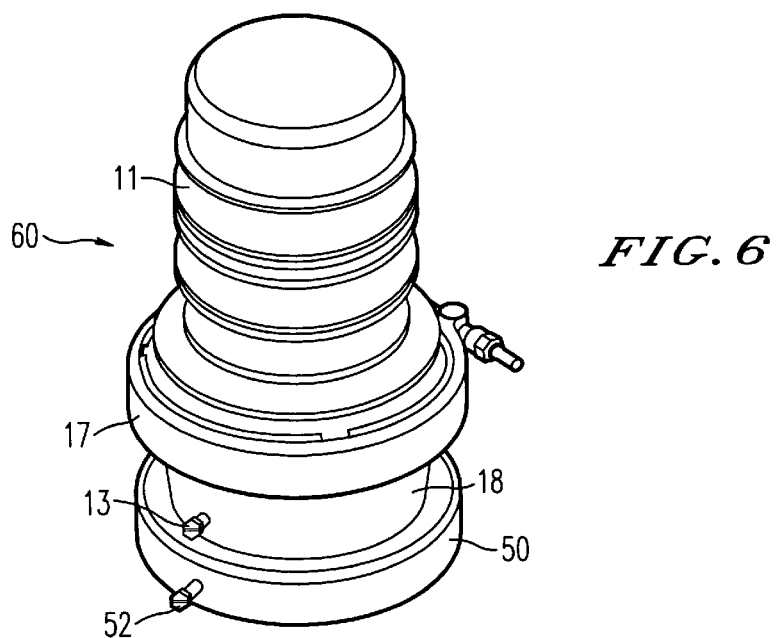

LED OBSTRUCTION LAMP

BACKGROUND OF THE INVENTION

1. Field of the Invention

The present invention is directed to an obstruction lamp which is LED illuminated. Such an LED obstruction lamp may find use in and around airports, and may be placed on the top of jet blast fences, runway edges, towers, mountains, tall buildings, etc.

2. Discussion of the Background

Currently, obstruction lamps utilized in and around airports utilize incandescent or fluorescent elements. Incandescent and fluorescent obstruction lamps are currently utilized because they meet FAA requirements. The U.S. Department of Transportation Advisory Circular 150/5345-43 specifies the requirements for obstruction lighting equipment. Of particular interest with respect to that Circular are the requirements for relamping, salt fog resistance, operating temperature range, and light intensity.

Incandescent obstruction lamps suffer from at least three significant drawbacks. A first drawback is that incandescent light bulbs are relatively inefficient, and thus use a large amount of power. A second drawback with incandescent obstruction lamps is that the incandescent light bulbs typically burn out within twelve to eighteen months. That is a particular drawback because obstruction lamps are typically placed over a large area in and around airports, and further are placed at locations which may be quite difficult and dangerous to reach. That is, obstruction lamps must be placed on the top of towers, on mountains, on tall buildings, etc. Due to the location of obstruction lamps, the replacement of burned out obstruction lamps can be very difficult and costly. A third drawback is that vibration of obstruction lamp modules can be quite extensive when mounted in certain locations, such as jet blast fences. That vibration can cause delicate lamp filaments in incandescent elements to break prematurely.

OBJECTS OF THE INVENTION

Accordingly, one object of the present invention is to provide a novel, long life, obstruction lamp for use in and around airports which can reduce maintenance costs, and particularly with respect to the costs associated with replacing burned out obstruction lamps.

A further object of the present invention is to provide a novel obstruction lamp with improved energy efficiency.

A further object of the present invention is to provide a novel obstruction lamp which can meet all appropriate FAA requirements, and in particular temperature and relamping.

A further object of the present invention is to provide a novel obstruction lamp which can be retrofitted onto existing obstruction lamp housings.

A further object of the present invention is to provide a novel obstruction lamp which is sealed against moisture and which is protected during handling.

SUMMARY OF THE INVENTION

To achieve the above and other objects, the present invention sets forth a novel obstruction lamp which replaces conventional incandescent obstruction lamps and which utilizes light emitting diodes (LEDs) in the illumination unit. The novel obstruction lamp of the present invention includes a first plurality of LEDs connected in series. The first plurality of LEDs are mounted onto a metal vertical cylinder, which provides a heat sinking for the first plurality of LEDs. A lens, with suitable optics, is configured to cover the first plurality of LEDs and the metal vertical cylinder. A metal base is provided on which the metal vertical cylinder, the lens, and signal conditioning circuitry are mounted. Further, a clamp is configured to attach and seal the lens to the metal base.

As a further feature of the novel obstruction lamp of the present invention, a second plurality of LEDs may be connected electrically independently of the first plurality of LEDs and mounted on top of the metal vertical cylinder to provide an improved aesthetic appearance.

As a further feature of the novel obstruction lamp of the present invention, a housing to enclose wire interconnections may be configured to attach to the metal base.

As a further feature of the novel obstruction lamp of the present invention, an adapter may be configured to attach between the metal base of the obstruction lamp and the base of a previously installed incandescent lamp.

As a further feature of the novel obstruction lamp of the present invention, the metal vertical cylinder can include driving circuit boards configured to drive the first and/or second plurality of LEDs.

As a further feature of the novel obstruction lamp of the present invention, the first plurality of LEDs may be high power LEDs and the second plurality of LEDs may be lower power LEDs which are provided more for aesthetic purposes than for providing needed light output.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein:

FIG. 5 shows an LED obstruction lamp of the present invention in a second embodiment including a separated adapter; and FIG. 6 shows the LED obstruction lamp of FIG. 5 as a single unit.

DESCRIPTION OF THE PREFERRED EMBODIMENTS

Figure 1:
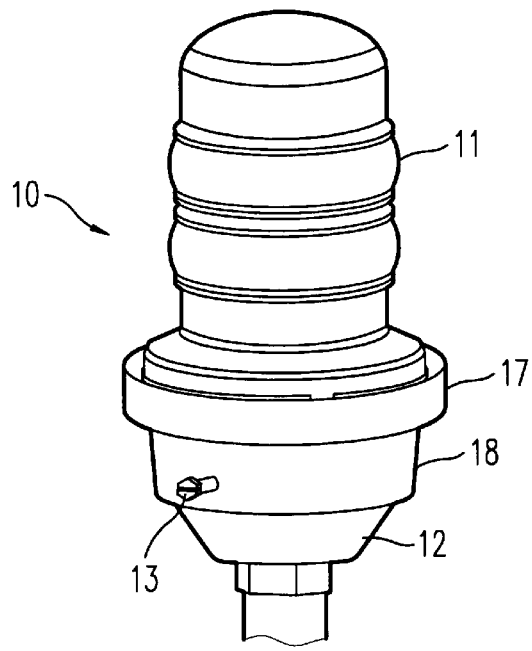
FIG. 1 shows an LED obstruction lamp of a first embodiment of the present invention.

Referring now to the drawings, wherein like reference numerals designate identical or corresponding parts throughout the several views, and more particularly to FIG. 1 thereof, a first embodiment of an LED obstruction lamp of the present invention is shown.

One significant feature of the present invention is that an obstruction lamp includes light emitting diodes (LEDs) as the illuminating system. In particular, the present invention can employ high power LEDs, capable of reliably operating at −55° C. (which is a FAA requirement). Use of LEDs provides significant benefits. First, LEDs are highly energy efficient, particularly in comparison with conventional incandescent light bulbs. Thus, the LED obstruction lamps of the present invention provide energy efficiency benefits over conventional incandescent obstruction lamps.

Further, LEDs have a lifetime typically 50 to 100 times greater than that of an incandescent light bulb. Therefore, the LED obstruction lamps of the present invention have to be replaced significantly less frequently than conventional incandescent obstruction lamps. That provides the significant benefit of reducing maintenance costs associated with the LED obstruction lamps of the present invention as they are spread out over a large area at an airport and are often placed at positions which are difficult to access for replacement.

FIG. 1 shows the LED obstruction lamp 10 in the first embodiment of the present invention as a completed unit. The LED obstruction lamp 10 includes an optical lens 11 mounted on a base 18. The base 18 is typically a metal casting for ruggedness, with good heat dissipation properties. The optical lens 11 houses LED elements as the illumination system of the LED obstruction lamp 10 of the present invention. A clamp 17 and gasket secures the lens 11 to the base 18. The base 18 in turn may be secured to a wire housing 12 by one or more screws 13. The wire housing 12 is provided to attach to a threaded conduit.

Figure 2:
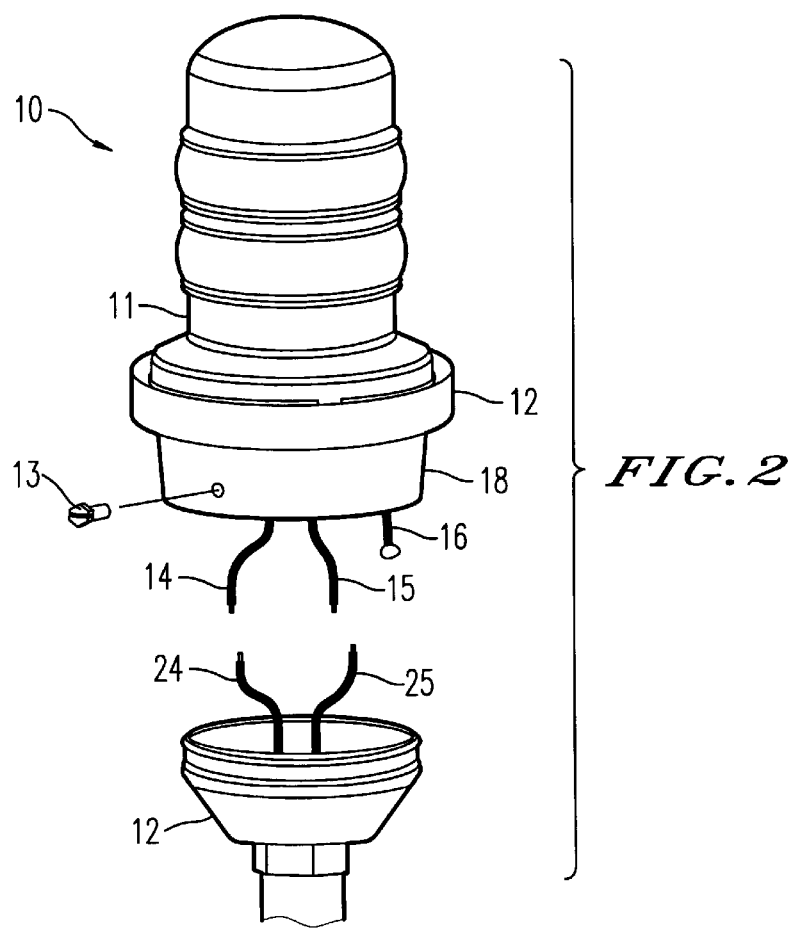
FIG. 2 shows the LED obstruction lamp of FIG. 1 separated from a wire housing.

FIG. 2 shows the LED obstruction lamp 10 in an expanded view with respect to the wire housing 12. As shown in FIG. 2, the wire housing 12 encloses two power-input wires 24 and 25 to connect to respective power wire leads 14 and 15 extending from the metal base 18. The wire leads 14 and 15 may typically be 120-volt AC power lines. Also extending from the metal base 18 is a ground lead 16. With such a structure in the present invention, providing power to LEDs and LED driving circuitry within the LED obstruction lamp 10 is simply performed by connecting wires 14 and 24 together, connecting wires 15 and 25 together, and grounding wire 16.

Figure 3:
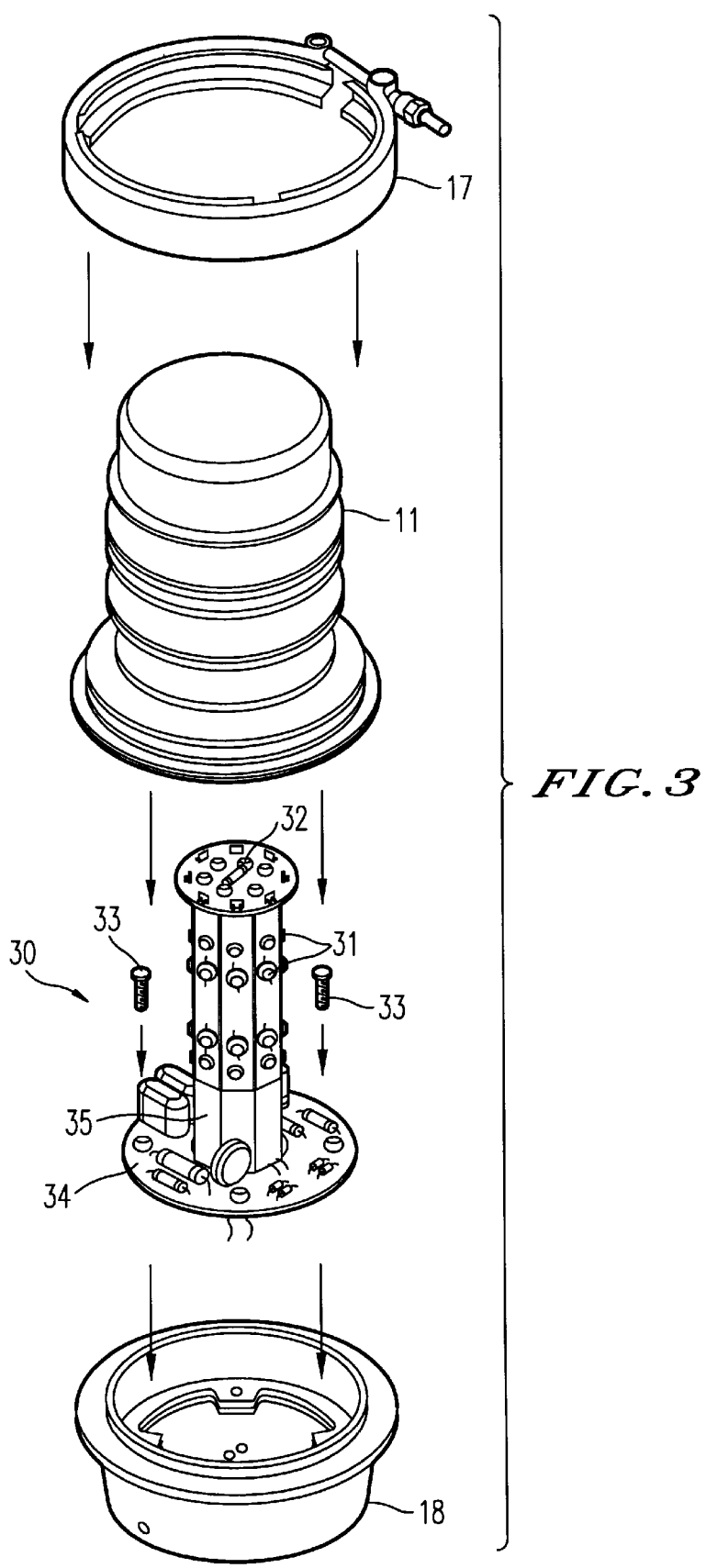
FIG. 3 shows an LED subassembly of the LED obstruction lamp of FIG. 1 in an expanded view from a top perspective.

FIG. 3 shows an expanded view of an LED subassembly of the LED obstruction lamp 10 of FIG. 1. FIG. 3 particularly shows the internal illuminating unit 30 on which the LEDs and LED driving circuitry are mounted. The internal illuminating unit 30 is covered by the lens 11 and is secured to the metal base 18 by screws 33.

The internal illuminating unit 30 includes a first plurality of LEDs 31 mounted on the sides of a metal vertical cylinder 35. The LEDs 31 are specifically chosen to be high power LEDs capable of thermal shock requirements from −55° C. Utilizing only 16 of such high power LEDs 31 provides an output of 32.5 candela in a 36° arc around the lamp as prescribed in the FAA Circular 150/5345-43.

Further, the metal vertical cylinder 35 is specifically designed to be made of a metal which provides a heat sinking for the first plurality of LEDs 31. It is important to provide a heat sinking for the high power LEDs 31 for maximizing life and minimizing light diminution.

The driving circuitry for driving the LEDs 31 is provided on a printed circuit board 34 attached to a bottom of the metal vertical cylinder 35. The printed circuit board 34 includes driving circuitry which can take any conventional form. The driving circuitry can more specifically be designed to provide power factor correction, harmonic distortion correction, intensity regulation, etc. as desired.

One feature of the present invention is that the LEDs 31 may be connected in series. The series wiring of the LEDs 31 is provided so that if one of the LEDs 31 fails, the entire series string of LEDs 31 is extinguished. That prevents any partially illuminated obstruction lamps from remaining undetected and in service. With the series connection it is always the case that full or no illumination is provided from the LEDs 31. Other possible embodiments could provide the LEDs 31 in series/parallel paths to provide continued illumination, albeit partial illumination.

The internal illuminating unit 30 also includes a second plurality of LEDs 32 mounted and providing light output on top of the metal vertical cylinders 35. The second plurality of LEDs 32 are electrically isolated from, i.e., at least not connected in series with, the first plurality of LEDs 31 and typically are lower power LEDs 32. An open circuit of any of the LEDs 32 will not cause LEDs 31 to be extinguished. The second plurality of LEDs 32 are provided more for aesthetic reasons than for illumination reasons.

More particularly, conventional incandescent obstruction lamps provide illumination from their sides and their tops. The first plurality of LEDs 31 would provide a substantial amount of illumination from the side of the lens 11, but not from a top of the lens 11. That would result in a difference in appearance between the LED obstruction lamp 10 of the present invention and a conventional incandescent obstruction lamp, which may be undesirable. Therefore, the LED obstruction lamp 10 of the present invention includes the second plurality of LEDs 32 on the top of the vertical metal cylinder 35 to provide illumination from the top of the lens 11. That provides the LED obstruction lamp 10 of the present invention with an overall illumination appearance which is similar to that of conventional incandescent obstruction lamps.

The second plurality of LEDs 31, however, are not required to be illuminated to meet FAA requirements, and are thus connected electrically independently from the first plurality of LEDs 31 because the second plurality of LEDs 32 are provided more for aesthetic reasons than for illumination reasons.

A further feature of the present invention is to insure that the LED subassembly shown in FIG. 3 is sealed against moisture and is protected during handling, such as occurs during wiring, installation, or removal. To achieve such a structure, the internal illumination unit 30 secured to the base 18 by the screws 33, covered by the lens 11, and held together by the clamp 17 and gasket is treated as a single module. Further, the bottom of the metal base 18 is closed and only provides sealed output holes for the lamp power wire leads 14, 15 and the ground 16. As a result, the entire single module is well sealed against moisture and is protected during handling.

Figure 4:
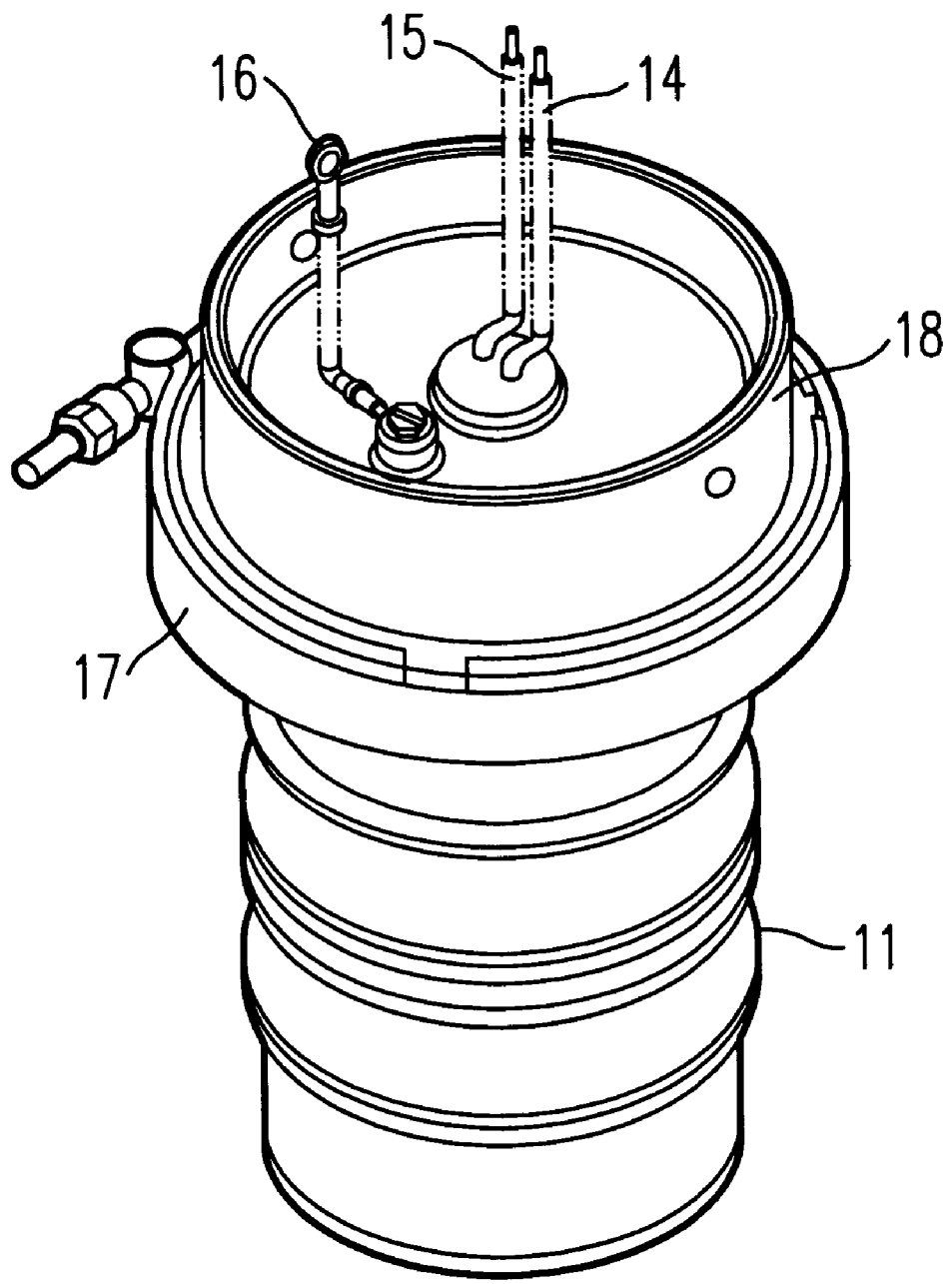
FIG. 4 shows the LED subassembly of FIG. 3 as a single unit and from a bottom perspective.

FIG. 4 shows the LED subassembly of FIG. 3 in assembled form and from a bottom perspective. As is shown in FIG. 4, the lamp power wire leads 14 and 15 and the ground 16 extend from the metal base 18. However, the entire LED subassembly of FIG. 4 is well sealed, as is shown in FIG. 4.

FIGS. 5 and 6 show a second embodiment of an LED obstruction lamp 60 of the present invention which includes a modification relative to the first embodiment of FIGS. 1–4 in not utilizing the wire housing 12, but instead utilizing an adapter 50 therefor. The other elements in the embodiment shown in FIGS. 5 and 6 are the same as in the embodiment shown in FIGS. 1–4.

In the embodiment as shown in FIGS. 5 and 6, the adapter 50 is provided to attach to the metal base 18. The adapter 50 is secured to the metal base 18 by screw 13. The screw 52 is provided to secure the LED obstruction lamp to a previously attached incandescent lamp base.

The adapter 50 is structured to provide an interface between an existing incandescent obstruction lamp system and the metal base 18. Such a structure thereby may provide easier retrofitting of the LED obstruction lamp 60 of the present invention onto existing incandescent obstruction lamp housings.

The LED obstruction lamps of FIGS. 1–6 provide the significant benefits of being highly energy efficient relative to incandescent obstruction lamps, and having a significantly longer lifetime than conventional incandescent obstruction lamps. Therefore, the LED obstruction lamps of the present invention will have to be replaced significantly less frequently than conventional incandescent obstruction lamps. That greatly reduces the maintenance costs associated with obstruction lamps. Further, the energy efficiency of the LED obstruction lamps of the present invention reduces their overall operating costs.

Obviously, numerous additional modifications and variations of the present invention are possible in light of the above teachings. It is therefore to be understood that within the scope of the appended claims, the present invention may be practiced otherwise than as specifically described herein.

What is claimed is:

1. An obstruction lamp, comprising:
   a) a first plurality of light emitting diodes (LEDs) connected in series;
   b) a metal vertical cylinder for heat sinking on which said first plurality of LEDs are mounted;
   c) a lens configured to cover said first plurality of LEDs and said metal vertical cylinder;
   d) a metal base on which said first plurality of LEDs, said metal vertical cylinder, and said lens are mounted; and
   e) a clamp configured to seal said lens to said metal base
   wherein said metal vertical cylinder b) includes b1) a driving circuit board configured to drive said first plurality of LEDs.

2. An obstruction lamp according to claim 1, further comprising:
   f) a second plurality of LEDs mounted on top of said metal vertical cylinder.

3. An obstruction lamp according to claim 1, further comprising:
   f) a wire housing configured to attach to said metal base and to enclose electrical connections to said first plurality of LEDs.

4. An obstruction lamp according to claim 2, further comprising:
   g) a wire housing configured to attach to said metal base and to enclose electrical connections to said first and second plurality of LEDs.

5. An obstruction lamp according to claim 1, further comprising:
   f) an adapter configured to attach to said metal base and to an incandescent obstruction lamp housing.

6. An obstruction lamp according to claim 2, further comprising:
   g) an adapter configured to attach to said metal base and to an incandescent obstruction lamp housing.

* * * * *